US007271452B2

(12) United States Patent
Arai

(10) Patent No.: US 7,271,452 B2
(45) Date of Patent: Sep. 18, 2007

(54) ANALOG SWITCH

(75) Inventor: Mitsuru Arai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 52 days.

(21) Appl. No.: 10/983,245

(22) Filed: Nov. 8, 2004

(65) Prior Publication Data

US 2005/0139931 A1    Jun. 30, 2005

(30) Foreign Application Priority Data

Dec. 24, 2003  (JP) ............................. 2003-427181

(51) Int. Cl.
*H01L 29/76* (2006.01)
*H01L 29/94* (2006.01)
(52) U.S. Cl. ..................... 257/371; 257/372; 257/393
(58) Field of Classification Search ................ 257/343, 257/369, 371, 372, 393; 327/389
See application file for complete search history.

(56) References Cited

U.S. PATENT DOCUMENTS

| 6,046,622 | A | 4/2000 | Miles |
| 6,924,535 | B2 * | 8/2005 | Hayashi ...................... 257/371 |
| 6,995,435 | B2 * | 2/2006 | Schuelein ..................... 257/369 |

FOREIGN PATENT DOCUMENTS

| JP | 05-218840 | 8/1993 |
| JP | 2000-077992 | 3/2000 |
| JP | 2001-510951 | 8/2001 |
| JP | 2003-158446 | 5/2003 |
| WO | WO9904493 | 1/1999 |

OTHER PUBLICATIONS

JPO Office Action dated Jan. 30, 2007, and English language translation.

* cited by examiner

*Primary Examiner*—Hung Vu
(74) *Attorney, Agent, or Firm*—Nixon Peabody LLP; Donald R. Studebaker

(57) ABSTRACT

An analog switch has a first circuit and a second circuit. The first circuit has an NMOS and PMOS connected in series, and the second circuit has a PMOS and NMOS connected in series. The first and second circuits are provided in parallel between an input terminal and output terminal of the analog switch. The gate of each NMOS is connected to a terminal to which a first clock signal is supplied, and the gate of each PMOS is connected to another terminal to which a second clock signal is supplied. The second clock signal is a reversal of the first clock signal. When the analog switch is set to the OFF state and a voltage that is above the supply potential is applied to the input terminal, the NMOSs become reverse-biased diodes. Therefore, an off leak current is not produced.

4 Claims, 3 Drawing Sheets

ANALOG SWITCH

BACKGROUND OF THE INVENTION

1. Field of the Invention

The present invention relates to a high-precision analog switch that is used for a chopper-type comparator.

2. Description of the Related Art

FIG. 2 of the attached drawings illustrates a basic configuration of a chopper-type comparator. FIG. 3 of the attached drawings is a circuit diagram of a conventional analog switch that is used in this chopper-type comparator.

As shown in FIG. 2, the chopper-type comparator includes analog switches (SW) 1 and 2 for accepting an input signal VIN or a reference voltage VREF in accordance with a clock signal CLK. One of the switches 1 and 2 is selected by the clock signal CLK. The chopper-type comparator also includes a capacitor 3 and inverter 4 that are serially connected to each other. The capacitor 3 is connected to the outputs of the analog switches 1 and 2. The chopper-type comparator further includes an analog switch 5 for establishing a short circuit between the input and output of the inverter 4 in accordance with the clock signal CLK.

The analog switches 1, 2, and 5 all have the same circuit constitution, and are constituted by a P-channel MOS transistor (called 'PMOS' hereinbelow) 11 and an N-channel MOS transistor (called 'NMOS' hereinbelow) 12 connected between terminals A and B, as shown in FIG. 3. The bulk of the PMOS 11 is connected to a power supply VDD and the bulk of the NMOS 12 is connected to ground potential GND. The gates of the PMOS 11 and NMOS 12 are connected to terminals EB and E respectively so that complementary clock signals CLKB and CLK are supplied to the gates of the PMOS 11 and NMOS 12 respectively. The clock signals CLKB and CLK are supplied to the analog switches 1, 5 and the analog switch 2 so that when the analog switches 1, 5 are turned on, the analog switch 2 is turned off, and vice versa.

With this chopper-type comparator, when the clock signal CLK is at level "H" or high level, the analog switches 1 and 5 are turned on and the analog switch 2 is turned off. As a result, the node N1, which is the input of the capacitor 3, has the input voltage VIN, and the nodes N2 and N3, which are the input and output of the inverter 4 respectively, have the threshold voltage VTH of the inverter 4. Accordingly, charging takes place such that the voltage between the output and input of the capacitor 3 becomes VTH−VIN.

When the clock signal CLK is at the level "L" or low level, the analog switches 1 and 5 are turned OFF and the analog switch 2 is turned ON. As a result, the potential of the node N1 is the reference voltage VREF and hence the potential of the node N2 is VTH−VIN+VREF because the voltage charged to the capacitor 3 is added. The potential of the node N2 is supplied to the inverter 4, which constitutes a comparator circuit. Hence, if this potential is higher than the threshold voltage VTH, that is, if VIN<VREF, the output signal OUT from the inverter 4 is "L". If VIN>VREF, the output signal OUT is "H".

When the analog switch 5 of the chopper-type comparator is in the OFF state, a parasitic diode D1 is formed between an N+ region, which is the drain of the PMOS 11, and a Psub substrate constituting the ground potential GND, as indicated by the dotted line in FIG. 3. Likewise, a parasitic diode D2 is formed between a P+ region, which is the drain of the NMOS 12, and a bulk N well, which is the supply potential VDD.

As a result, when the clock signal CLK is "L", the analog switch 5 is OFF, and the potential of the node N2 (=VTH−VIN+VREF) is higher than the supply potential VDD, then the parasitic diode D1 is in the forward-biased direction and the electric charge accumulated in the capacitor 3 is discharged, whereby the potential of the node N2 fluctuates. When the potential of the node N2 is lower than the ground potential GND, then the parasitic diode D2 is ON in the forward-biased direction and hence the electric charge accumulated in the capacitor 3 is discharged, whereby the potential of the node N2 fluctuates. Therefore, in the chopper-type comparator that uses conventional analog switches, the input voltage VIN must satisfy the following condition so that the parasitic diodes D1 and D2 of the analog switches are not turned ON:

$$VREF-VTH<VIN<VREF+VTH$$

SUMMARY OF THE INVENTION

One object of the present invention is to provide an improved analog switch that is used in a chopper-type comparator. Specifically, the present invention provides an analog switch that is able to retain the OFF state reliably without an off leak current being produced even when the input voltage is not between the ground potential GND and the supply potential VDD. This gives an accurate comparison result with respect to a broad range of input voltage VIN.

According to a first aspect of the present invention, there is provided an analog switch that has a first first-conductivity-type transistor, a second first-conductivity-type transistor, and a single second-conductivity-type transistor. The first-conductivity-type transistor is, for example, a PMOS. The second-conductivity-type transistor is, for example, an NMOS. The drain of the first first-conductivity-type transistor is connected to an input terminal of the analog switch. The gate of the first first-conductivity-type transistor is connected to a first supply potential (e.g., ground potential). The drain of the second-conductivity-type transistor is connected to the source of the first first-conductivity-type transistor. The source of the second-conductivity-type transistor is connected to the output terminal of the analog switch. The bulk of the second-conductivity-type transistor is connected to the first supply potential. The gate of the second-conductivity-type transistor is supplied with an on/off control signal. The drain of the second first-conductivity-type transistor is connected to the input terminal. The source of the second first-conductivity-type transistor is connected to the output terminal. The bulk of the second first-conductivity-type transistor is connected to a second supply potential (e.g., a positive potential). The gate of the second first-conductivity-type transistor is supplied with a signal rendered by inverting the on/off control signal.

When the analog switch is turned OFF by the on/off control signal, the NMOS or PMOS connected to the input terminal becomes a reverse-biased diode. Hence, an off leak current can be reliably prevented even when a voltage higher than the supply potential or a voltage below ground potential is applied to the input terminal.

According to a second aspect of the present invention, there is provided another analog switch that includes a first P-channel MOS transistor, a first N-channel MOS transistor, a second N-channel MOS transistor and a second P-channel MOS transistor. The drain of the first P-channel MOS transistor is connected to the input terminal of the analog switch. The gate of the first P-channel MOS transistor is supplied with an on/off control signal. The drain of the first N-channel MOS transistor is connected to the input terminal of the analog switch. The gate of the first N-channel MOS transistor is supplied with a second control signal rendered by inverting the on/off control signal. The drain of the second N-channel MOS transistor is connected to the source of the first P-channel MOS transistor. The source of the second N-channel MOS transistor is connected to the output terminal of the analog switch. The bulk of the second N-channel MOS transistor is connected to ground potential. The gate of the second N-channel MOS transistor is supplied with the on/off control signal. The drain of the second P-channel MOS transistor is connected to the source of the first N-channel MOS transistor. The source of the second P-channel MOS transistor is connected to the output terminal of the analog switch. The bulk of the second P-channel MOS transistor is connected to the supply potential. The gate of the second P-channel MOS transistor is supplied with the second control signal.

When the analog switch is turned OFF by the on/off control signal, the serially connected NMOS and PMOS are both turned OFF. Hence, an off leak current can be reliably prevented even when a voltage higher than the supply potential or a voltage below ground potential is applied to the input terminal.

These and other objects, aspects and advantages of the present invention will become apparent to those skilled in the art from the following detailed description and appended claims when read and understood in conjunction with the attached drawings.

DETAILED DESCRIPTION OF THE INVENTION

Embodiments of the present invention will now be described with reference to the attached drawings. It should be noted that the drawings merely show examples of the invention to help an understanding of the invention, and do not limit the scope of the invention. Similar reference symbols are assigned to similar elements in all the drawings.

First Embodiment

Figure 1:
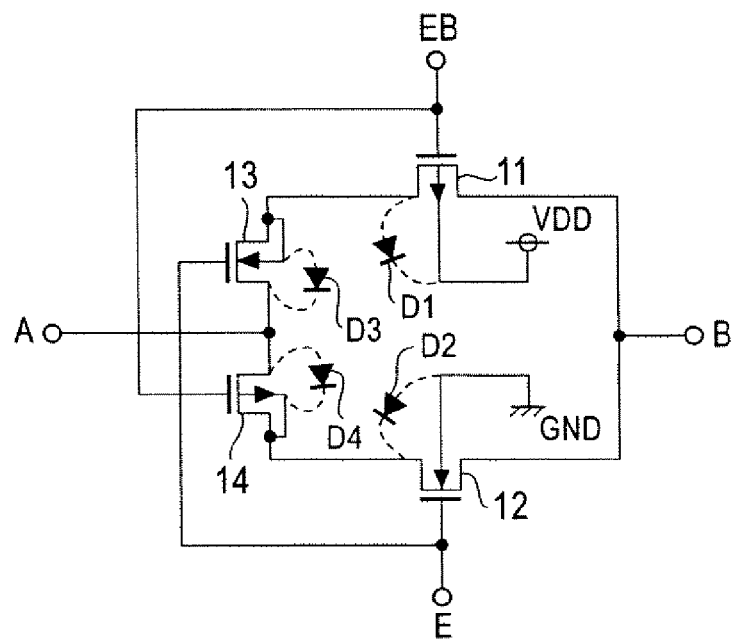
FIG. 1 is a circuit diagram of an analog switch according to a first embodiment of the present invention.

Referring to FIG. 1, an analog switch of the first embodiment of the present invention will be described.

Figure 2:
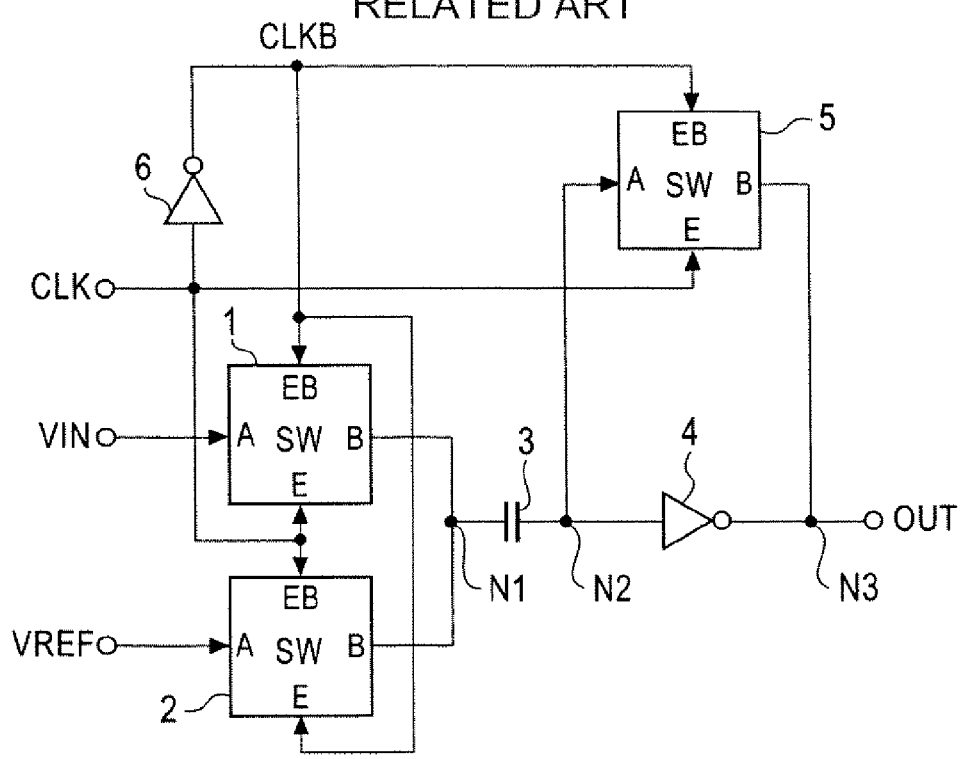
FIG. 2 illustrates a basic constitution of a chopper-type comparator.
Figure 3:
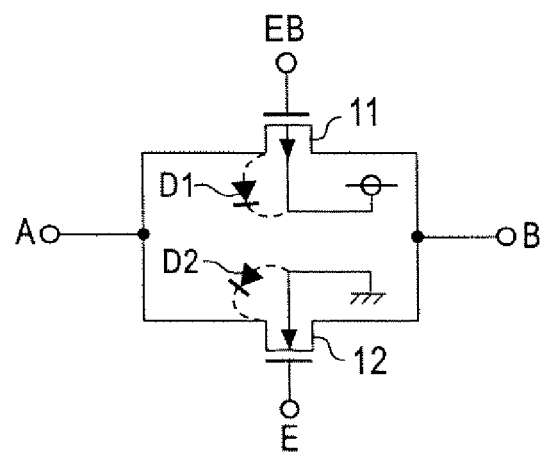
FIG. 3 is a circuit diagram of a conventional analog switch.

The analog switch is employed as the analog switch 5 of the chopper-type comparator in FIG. 2. The respective drains of the NMOS 13 and PMOS 14 are connected to the input terminal A of the analog switch. The source of the NMOS 13 is connected to the drain of the PMOS 11 and the source of the PMOS 11 is connected to the output terminal B of the analog switch. The source of the PMOS 14 is connected to the drain of the NMOS 12 and the source of the NMOS 12 is connected to the output terminal B.

The bulks of the PMOS 11 and NMOS 12 are connected to the supply potential VDD and ground potential GND respectively, and the bulks of the NMOS 13 and PMOS 14 are connected to the respective sources thereof. The gates of the PMOS 11 and 14 are connected to the terminal EB to which the clock signal CLKB is supplied, and the gates of the NMOS 12 and 13 are connected to the terminal E to which the clock signal CLK is supplied.

Figure 4:
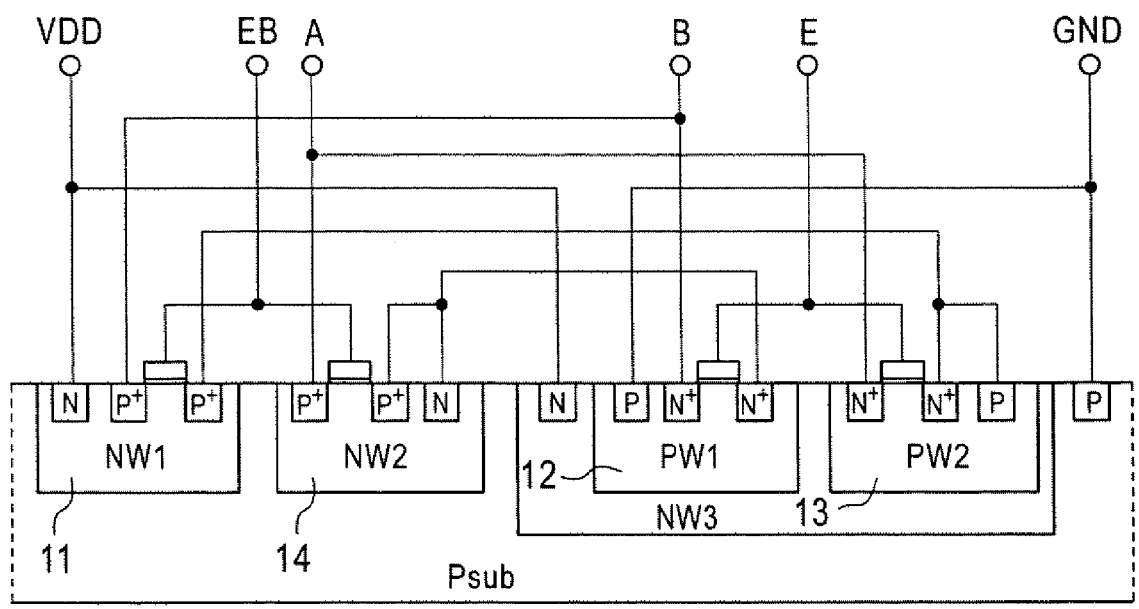
FIG. 4 is a schematic diagram showing an example of the structure of the analog switch in FIG. 1.

FIG. 4 is a schematic diagram that shows an example of the structure of the analog switch in FIG. 1.

The PMOS 11 and 14 of the analog switch are formed in N wells NW1 and NW2 that are provided independently in the P-type substrate Psub. Another N well NW3 is provided in the P-type substrate Psub, and two NMOS 12 and 13 are formed within two P wells PW1 and PW2 respectively that are provided independently in the N well NW3. The bulks of the N wells NW1 and NW3 are connected to the supply potential VDD, and the bulk of the P well PW1 and the P-type substrate Psub are connected to the ground potential GND.

The operation of the analog switch will be described next.

When the "H" clock signal CLK and "L" clock signal CLKB are supplied to the analog-switch terminals E and EB respectively, all of the PMOS 11 and 14 and NMOS 12 and 13 are turned ON and therefore the terminals A and B are connected to each other. As a result, a short circuit is formed in the analog switch between the input and output of the inverter, which is the comparator circuit of the chopper-type comparator. Accordingly, the input voltage and output voltage of the analog switch become the threshold voltage VTH of the inverter, which is generally half the supply potential VDD.

When the "L" clock signal CLK and "H" clock signal CLKB are supplied to the analog-switch terminals E and EB respectively, all the PMOS 11 and 14 and NMOS 12 and 13 are turned OFF. Then, as indicated by the dotted lines in the drawing, a parasitic diode D1 is formed between the drain and bulk of the PMOS 11, and a reverse-biased parasitic diode D4 is formed between the drain and bulk of the PMOS 14. Likewise, a parasitic diode D2 is formed between the drain and bulk of the NMOS 12, and a reverse-biased parasitic diode D3 is formed between the drain and bulk of the NMOS 13.

Accordingly, when a voltage at or above the supply potential VDD is applied to the input terminal A, current is prevented from flowing from the input terminal A to the supply potential VDD via the parasitic diode D1 because the reverse-biased parasitic diode D3 is present. Current is also prevented from flowing from the terminal A to the ground potential GND by the parasitic diode D2. On the other hand, when a voltage at or below the ground potential GND is applied to the terminal A, current is prevented from flowing to the terminal A from the ground potential GND via the parasitic diode D2 because the reverse-biased parasitic diode D4 is present. Current is also prevented from flowing from the supply potential VDD to the terminal A by the parasitic diode D1.

Therefore, when the analog switch is set to the OFF state, the OFF state can be retained even if the input voltage supplied to the terminal A is at or above the supply potential VDD or at or below the ground potential GND.

Accordingly, in the analog switch of the first embodiment, two sets of PMOS and NMOS are serially connected between the input terminal A and output terminal B, and these PMOS and NMOS are turned ON and OFF simultaneously by the clock signals CLK and CLKB. Thus, when the analog switch is set to the OFF state, an off leak current is not produced and hence the OFF state can be retained completely even if the voltage applied to the input terminal A is at or above the supply potential VDD or at or below the ground potential GND.

Second Embodiment

Figure 5:
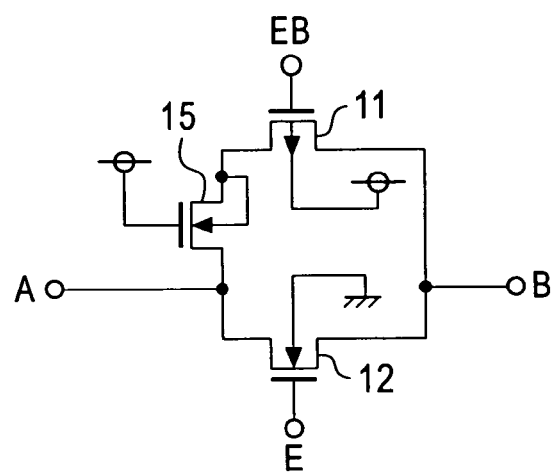
FIG. 5 is a circuit diagram of an analog switch according to a second embodiment of the present invention.

Referring to FIG. 5, an analog switch of the second embodiment of the present invention will be described. This analog switch is used as the analog switch of a chopper-type comparator as per the analog switch in FIG. 1.

The respective drains of the NMOS 12 and 15 are connected to the input terminal A of the analog switch, and the source of the NMOS 12 is connected to the output terminal B of the analog switch. The source of the NMOS 15 is connected to the drain of the PMOS 11 and the source of the PMOS 11 is connected to the output terminal B. The bulks of the PMOS 11 and NMOS 12 are connected to the supply potential VDD and ground potential GND respectively, and the bulk of the NMOS 15 is connected to the source thereof.

The gate of the PMOS 11 is also connected to a terminal EB to which the clock signal CLKB is supplied, and the gate of the NMOS 12 is connected to a terminal E to which the clock signal CLK is supplied. The gate of the NMOS 15 is connected to the supply potential VDD.

In this analog switch, the N well NW2 in FIG. 4 is removed, the NMOS 15 is provided in place of the NMOS 13 in the P well PW2 and the gate of the NMOS 15 is connected to the supply potential VDD.

The operation of the analog switch will be described next.

When the "H" clock signal CLK and "L" clock signal CLKB are supplied to the analog-switch terminals E and EB respectively, the PMOS 11 and NMOS 12 are turned ON. The NMOS 15 is turned ON because the gate is connected to the supply potential VDD. Therefore, the terminals A and B are connected to each other.

When the "L" clock signal CLK and "H" clock signal CLKB are supplied to the analog-switch terminals E and EB respectively, the PMOS 11 and NMOS 12 are turned OFF. Then, as shown in FIG. 1, the parasitic diode D1 is formed between the drain and bulk of the PMOS 11, and the reverse-biased parasitic diode D2 is formed between the drain and bulk of the NMOS 12. When a voltage between the ground potential GND and the supply potential VDD is applied to the terminal A, the parasitic diodes D1 and D2 prevent a current from flowing from the terminal A to the ground potential GND and from the supply potential VDD to the terminal A.

On the other hand, when a voltage at or above the supply potential VDD is applied to the terminal A, the voltage Vgs across the gate and source of the NMOS 15 is smaller than zero (Vgs<0), and the NMOS 15 is turned OFF. Because a reverse-biased diode is formed between the N+ region of the source of the NMOS 15 and the P-type bulk, current does not flow to the parasitic diode that is formed between the P+ region of the drain of the PMOS 11 and the P-type substrate Psub. Because the parasitic diode D2 of the NMOS 12 is reverse-biased, current does not flow to the parasitic diode D2.

As described above, the analog switch of the third embodiment has the NMOS 15 provided serially between the input terminal A and the PMOS 11 to connect the gate to the supply potential VDD. As a result, there is the advantage that when the analog switch is set to the OFF state, the OFF state can be completely retained even when a voltage that is at or above the supply potential VDD is applied to the terminal A.

Third Embodiment

Figure 6:
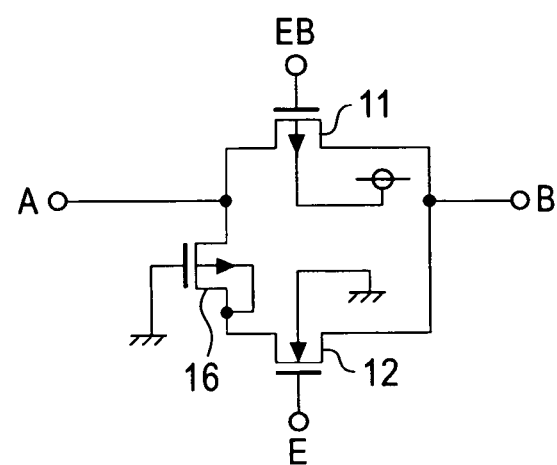
FIG. 6 is a circuit diagram of an analog switch according to a third embodiment of the present invention.

FIG. 6 illustrates a circuit diagram of the analog switch according to the third embodiment of the present invention. Similar to the analog switch of FIG. 1, the analog switch of FIG. 6 is used as an analog switch of a chopper-type comparator.

The respective drains of the PMOS 11 and 16 are connected to the input terminal A of the analog switch, and the source of the PMOS 11 is connected to the output terminal B. The source of the PMOS 16 is connected to the drain of the NMOS 12, and the source of the NMOS 12 is connected to the terminal B. The bulks of the PMOS 11 and NMOS 12 are connected to the supply potential VDD and ground potential GND respectively, and the bulk of the PMOS 16 is connected to the source thereof.

The gate of the PMOS 11 is connected to the terminal EB to which the clock signal CLKB is supplied, and the gate of the NMOS 12 is connected to the terminal E to which the clock signal CLK is supplied. The gate of the PMOS 16 is connected to the ground potential GND.

In this embodiment, the P well PW2 in FIG. 4 is removed, the PMOS 16 is provided in place of the PMOS 14 in the N well NW2, and the gate of the PMOS 16 is connected to the ground potential GND.

The operation of the analog switch will be described below.

When the "H" clock signal CLK and "L" clock signal CLKB are supplied to the analog-switch terminals E and EB respectively, the PMOS 11 and NMOS 12 are turned ON. The PMOS 16 is ON because the gate is connected to the ground potential GND. Therefore, the terminals A and B are connected to each other.

When the "L" clock signal CLK and "H" clock signal CLKB are supplied to the analog-switch terminals E and EB respectively, the PMOS 11 and NMOS 12 are turned OFF. Thereupon, as shown in FIG. 1, the parasitic diode D1 is formed between the drain and bulk of the PMOS 11, and the reverse-biased parasitic diode D2 is formed between the drain and bulk of the NMOS 12. Therefore, when the voltage between the ground potential GND and the supply potential VDD is applied to the terminal A, the parasitic diodes D1 and D2 prohibit current from flowing from the terminal A to the ground potential GND and from the supply potential VDD to the terminal A.

On the other hand, when a voltage that is at or below the ground potential GND is applied to the terminal A, the voltage Vgs across the gate and source of the PMOS 16 is greater than zero (Vgs>0), and the PMOS 16 is turned OFF. Because a reverse-biased diode is formed between the P+ region of the source of the PMOS 16 and the N-type bulk, current does not flow to the parasitic diode that is formed between the N+ region of the drain of the NMOS 12 and the P-type substrate Psub. Because the parasitic diode D1 of the PMOS 11 is reverse-biased, current does not flow to the parasitic diode D1.

As mentioned earlier, the analog switch of the third embodiment has the PMOS 16 provided serially between the input terminal A and the NMOS 12 to connect the gate to the ground potential GND. As a result, when the analog switch is set to the OFF state, there is the advantage that the OFF state can be completely retained even when a voltage that is at or below the ground potential GND is applied to the terminal A.

Fourth Embodiment

Figure 7:
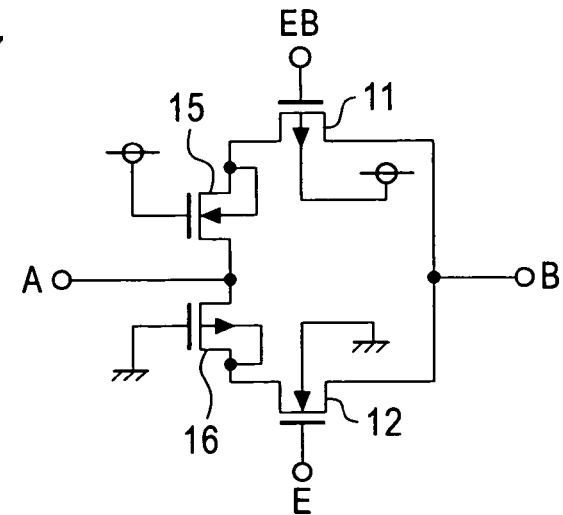
FIG. 7 is a circuit diagram of an analog switch according to a fourth embodiment of the present invention.

FIG. 7 is a circuit diagram of an analog switch according to the fourth embodiment of the present invention. This analog switch is used as the analog switch of a chopper-type comparator as per the analog switch in FIG. 1.

This analog switch is made by combining the analog switches shown in FIGS. 5 and 6. Specifically, the respective drains of the NMOS 15 and PMOS 16 are connected to the input terminal A, and the respective sources of the PMOS 11 and NMOS 12 are connected to the output terminal B. The source of the NMOS 15 is connected to the drain of the PMOS 11 and the source of the PMOS 16 is connected to the drain of the NMOS 12. The bulks of the PMOS 11 and NMOS 12 are connected to the supply potential VDD and ground potential GND respectively and the bulks of the NMOS 15 and PMOS 16 are connected to the respective sources thereof.

The gate of the PMOS 11 is connected to the terminal EB to which the clock signal CLKB is supplied and the gate of NMOS 12 is connected to the terminal E to which the clock signal CLK is supplied. The gates of the NMOS 15 and PMOS 16 are connected to the supply potential VDD and ground potential GND respectively.

In the analog switch, the NMOS 15 is provided in place of the NMOS 13 in the P well PW2 in FIG. 4, the gate of the NMOS 15 is connected to the supply potential VDD, the PMOS 16 is provided in place of the PMOS 14 in the N well NW2, and the gate of the PMOS 16 is connected to the ground potential GND.

The operation of the analog switch will be described next.

When the "H" clock signal CLK and "L" clock signal CLKB are supplied to the analog-switch terminals E and EB respectively, the PMOS 11 and NMOS 12 are turned ON. The NMOS 15 is ON because the gate thereof is connected to the supply potential VDD, and the PMOS 16 is ON because the gate thereof is connected to the ground potential GND. Therefore, the terminals A and B are connected to each other.

When the "L" clock signal CLK and "H" clock signal CLKB are supplied to the analog-switch terminals E and EB respectively, the PMOS 11 and NMOS 12 are turned OFF. Then, as per FIG. 1, the parasitic diode D1 is formed between the drain and bulk of the PMOS 11, and the reverse-biased parasitic diode D2 is formed between the drain and bulk of the NMOS 12. Therefore, when the voltage between the ground potential GND and supply potential VDD is applied to the terminal A, the parasitic diodes D1 and D2 prohibit current from flowing from the terminal A to the ground potential GND and from the supply potential VDD to the terminal A.

On the other hand, when a voltage at or above the supply potential VDD is applied to the terminal A, the voltage across the gate and source of the NMOS 15 is negative and the NMOS 15 is turned OFF. As a result, a reverse-biased diode is formed between the N+ region of the source of the NMOS 15 and the P-type bulk. Therefore, current does not flow to the parasitic diode that is formed between the P+ region of the drain of the PMOS 11 and the P-type substrate Psub. Because the parasitic diode D2 of the NMOS 12 is reverse-biased, current does not flow to the parasitic diode D2.

When a voltage at or below the ground potential GND is applied to the terminal A, the voltage across the gate and source of the PMOS 16 is positive and the PMOS 16 is turned OFF. As a result, a reverse-biased diode is formed between the P+ region of the source of the PMOS 16 and the N-type bulk and therefore current does not flow to the parasitic diode that is formed between the N+ region of the drain of the NMOS 12 and the P-type substrate Psub. The parasitic diode D1 of the PMOS 11 is reverse-biased so that no current flows to the parasitic diode D1.

As described above, in the analog switch of the fourth embodiment, the NMOS 15 connecting the gate to the supply potential VDD is provided serially between the input terminal A and the PMOS 11, and the PMOS 16 connecting the gate to the ground potential GND is provided serially between the terminal A and NMOS 12. Thus, there is the advantage that when the analog switch is set to the OFF state by the clock signal CLK, an off leak current is not produced and hence the OFF state can be retained completely even when a voltage at or above the supply potential VDD or at or below the ground potential GND is applied to the terminal A.

It should be noted that the above described embodiments are mere examples, and the present invention should not be limited to the embodiments. Rather, a variety of modifications can be implemented within the scope of the invention. For example, the following modifications can be made.

(a) Although the bulks of the NMOS 13 and 15 are connected to the respective sources thereof, the bulks may be in a connectionless state. Likewise, the respective bulks of the PMOS 14 and 16 may be in a connectionless state.

(b) The circuit configuration of the chopper-type comparator, to which the analog switch is applied, is not restricted to the circuit configuration shown in FIG. 2. The off leak current can be reduced by applying the present invention to an analog switch to which an input voltage that exceeds the range from the ground potential to the supply potential is applied.

(c) Although each of the PMOS 11, 14, and 16, and the NMOS 12, 13, and 15 is constituted by a single transistor, same can be constituted by connecting a plurality of transistors of the same type in series.

(d) The structure of the analog switch is not limited to the structure illustrated in FIG. 4. For example, although the NMOS 12 and 13 are provided in the P-type structure Psub by means of a double-well structure in FIG. 4, this may be changed to any other suitable configuration as long as the individual transistors can be completely isolated from each other. Further, each of the transistors can also be formed by using an N-type substrate.

This application is based on Japanese Patent Application No. 2003-427181 filed on Dec. 24, 2003, and the entire disclosure thereof is incorporated herein by reference.

What is claimed is:

1. An analog switch comprising:
an input terminal;
an output terminal;
a first P-channel MOS transistor having a first drain and a first gate, the first drain being connected to the input terminal and the first gate being supplied with a first on/off control signal;
a first N-channel MOS transistor having a second drain, a second source, a second bulk and a second gate, the second drain being connected to the input terminal, and the second gate being supplied with a second control signal rendered by inverting the on/off control signal;

a second N-channel MOS transistor having a third drain, a third source, a third bulk and a third gate, the third drain being connected to the first source of the first P-channel MOS transistor, the third source being connected to the output terminal, the third bulk being connected to ground potential, and the third gate being supplied with the first on/off control signal; and a second P-channel MOS transistor having a fourth drain, a fourth source, a fourth bulk and a fourth gate, the fourth drain being connected to the second source of the first N-channel MOS transistor, the fourth source being connected to the output terminal, the fourth bulk being connected to the supply potential, and the fourth gate being supplied with the second control signal, wherein the analog switch is turned off when the first off control signal is supplied to the first and third gates and the second off control signal is supplied to the second and fourth gates, whereby an off state of the analog switch is maintained even if the input terminal is supplied with a voltage greater than a power source voltage or lower than a ground voltage.

2. The analog switch according to claim 1, wherein the first P-channel MOS transistor is a set of P-channel MOS transistors connected to each other in series, the first N-channel MOS transistor is a set of N-channel MOS transistors connected to each other in series, the second N-channel MOS transistor is a set of N-channel MOS transistors connected to each other in series, and the second P-channel MOS transistor is a set of P-channel MOS transistors connected to each other in series.

3. The analog switch according to claim 1, wherein the first P-channel MOS transistor is different from the first N-channel MOS transistor in terms of channel conductance and/or threshold voltage, and the second N-channel MOS transistor is different from the second P-channel MOS transistor in terms of channel conductance and/or threshold voltage.

4. The analog switch according to claim 1 further comprising a substrate having a triple-well structure, and wherein the first P-channel MOS transistor, first N-channel MOS transistor, second N-channel MOS transistor and second P-channel MOS transistor are provided on the substrate.

* * * * *